US012660125B2

(12) United States Patent
Niederer

(10) Patent No.: US 12,660,125 B2
(45) Date of Patent: Jun. 16, 2026

(54) ELECTRIC HEATING DEVICE

(71) Applicant: Eberspächer catem GmbH & Co. KG, Herxheim (DE)

(72) Inventor: Michael Niederer, Kapellen-Drusweiler (DE)

(73) Assignee: Eberspacher catem GmbH & Co. KG, Herxheim (DE)

( * ) Notice: Subject to any disclaimer, the term of this patent is extended or adjusted under 35 U.S.C. 154(b) by 77 days.

(21) Appl. No.: 18/677,221

(22) Filed: May 29, 2024

(65) Prior Publication Data

US 2024/0407132 A1 Dec. 5, 2024

(30) Foreign Application Priority Data

May 30, 2023 (DE) ..................... 10 2023 114 077.9

(51) Int. Cl.
H05K 7/20 (2006.01)
H05B 1/02 (2006.01)
H05B 3/06 (2006.01)

(52) U.S. Cl.
CPC ....... H05K 7/20272 (2013.01); H05B 1/0236 (2013.01); H05B 3/06 (2013.01); H05K 7/20281 (2013.01); *H05K 2203/02* (2013.01)

(58) Field of Classification Search
CPC ... H05B 1/0236; F24H 9/1872; F24H 9/1827; F24H 9/2014–2028; F04D 29/5813
See application file for complete search history.

(56) References Cited

U.S. PATENT DOCUMENTS

| | | | |
|---|---|---|---|
| 10,576,805 B2 * | 3/2020 | Gschwind | F24H 3/0435 |
| 2008/0000889 A1 * | 1/2008 | Niederer | F24H 3/082 |
| | | | 219/205 |
| 2012/0193339 A1 * | 8/2012 | Adachi | F24H 1/009 |
| | | | 219/202 |
| 2018/0015805 A1 * | 1/2018 | Gschwind | B60H 1/14 |

FOREIGN PATENT DOCUMENTS

| | | | | |
|---|---|---|---|---|
| DE | 3906603 A1 * | 9/1990 | .......... | F24H 9/2028 |
| DE | 4106273 C1 * | 5/1992 | .......... | F24H 9/2028 |
| DE | 4211590 C1 * | 10/1993 | .......... | F24H 9/2028 |
| DE | 11 2014 002 402 T5 | 5/2013 | | |
| DE | 202019005221 U1 * | 2/2020 | .............. | H05B 3/06 |
| DE | 10 2020 117 366 | 1/2022 | | |

(Continued)

*Primary Examiner* — Topaz L. Elliott
(74) *Attorney, Agent, or Firm* — Boyle Fredrickson, SC

(57) ABSTRACT

An electric heating device includes an electronics housing with a partition wall which separates a connection chamber from a heating chamber for emitting heat to a medium to be heated, and a fluid housing which delimits the heating chamber. At least one PTC heating device is connected to the heating chamber in a thermally conductive manner and is electrically connected in the connection chamber. A control device is located, at least in part, in the connection chamber and includes a circuit breaker that bears against a channel base. The channel base is located outside the heating chamber and is formed by the partition wall. The channel base, together with a channel top, forms a channel through which the medium can flow. This eliminates the need for complex heat sinks or the like, and the waste heat from the circuit breaker can be used to heat the medium.

14 Claims, 1 Drawing Sheet

(56) References Cited

FOREIGN PATENT DOCUMENTS

| DE | 102022131377 A1 * | 5/2024 | ........... F24H 9/2028 |
| EP | 1 872 986 | 1/2008 | |
| EP | 2455680 A2 * | 5/2012 | ........... H05K 1/0272 |
| EP | 2884817 A1 * | 6/2015 | ........... B60H 1/2221 |
| EP | 4265977 A1 * | 10/2023 | ............. F24H 1/121 |

* cited by examiner

ELECTRIC HEATING DEVICE

BACKGROUND OF THE INVENTION

1. Field of the Invention

The present invention relates to an electric heating device (sometimes known as an electrical heating device) comprising at least one PTC heating device and a control device with at least one circuit breaker. The electric heating device is used in particular in motor vehicles, especially in partially or fully electrically powered motor vehicles.

2. Background of Related Art

Such an electric heating device is known, for example, from EP 1 872 986 A1 and its counterpart U.S. Pat. No. 8,946,599. The electric heating device has at least one PTC heating device, which comprises an electrically contactable PTC element. For contacting, the PTC element has two poles, which are formed, for example, by corresponding contact plates, which lie against the PTC element and, together with corresponding insulation layers, which form an electrical insulation of the contacting, form the PTC heating device. For operation, a voltage, for example 48 volts or more, is applied to the two poles of the PTC heating device. A power current of 100 amperes or more, for example, then flows through the PTC heating device. The power current is switched via a power switch, which is provided in the electrical heating device as part of a control device. Switching large currents generates a high level of waste heat at the circuit breaker, which must be dissipated.

To dissipate the heat, it is known from DE 10 2020 117 366 A1 and its counterpart US 2022/0007465, for example, to place the circuit breaker against a heat sink with a heat sink via a spring element. The spring element must be made of a spring material with good heat-conducting properties, such as copper-beryllium. The heat sink is located in a connection chamber so that the heat sink radiates the waste heat into the connection chamber. This solution has a complex structure, and the waste heat from the circuit breaker is radiated unused into the connection chamber. If the waste heat is too high, for example if high power currents are switched via the circuit-breaker, this can lead to overheating of the connection chamber.

SUMMARY

The present invention is based on the problem of providing a solution that enables more efficient dissipation of waste heat from the circuit breaker with a simpler design.

To solve this problem, an electrical heating device is proposed comprising an electronics housing with a partition wall which separates a connection chamber from a heating chamber for emitting heat to a medium to be heated, and a fluid housing which delimits the heating chamber, wherein at least one PTC heating device is formed which is connected to the heating chamber in a heat-conducting manner and which is electrically connected in the connection chamber, wherein a control device with at least one circuit breaker is formed in the connection chamber. The circuit breaker is located on a channel base formed by the partition wall outside the heating chamber, which together with a channel top, forms a channel through which the medium can flow. The channel base may generally extend parallel to the partition wall.

At least one heating device housing may protrude from the partition wall in the direction of the heating chamber, which heating device housing forms a receiving pocket in which at least one PTC heating device is supported in an insulated manner.

The electrical heating device according to the present invention may be used in a motor vehicle, such as a partially or fully electrically powered motor vehicle. The PTC heating device comprises at least one PTC element, which has conductive tracks connected to it, which are electrically connected in the connection chamber. The conductor tracks are used to supply the PTC element with current of different polarity. In this way, the power current for operating the PTC element is fed to the PTC element via the connection chamber. The at least one PTC element and the conductor tracks are insulated and supported in the holding pocket. The insulating support can be provided, for example, by insulating plates that lie flat against the outside of the conductor tracks. The conductor tracks may be designed as contact plates.

In order to operate the PTC heating device with good efficiency, it is necessary to dissipate the heat generated by the PTC element as well as possible to both sides of the main side surfaces of the PTC element. The PTC element may be rectangular in shape. The main side surfaces are the side surfaces of the cuboid with the largest surface area. These main side surfaces may be connected to each other by a circumferential edge of the PTC element, which usually has edge surfaces extending at right angles to the main side surfaces. The area of each main side surface may be at least a factor of 5 larger than the area of one of the edge surfaces. The heating device housing may form a type of heating rib that protrudes into the heating chamber.

The PTC elements are usually sintered ceramic bricks, which are usually metallized on their main side surfaces to introduce the power current into the PTC element. These ceramic components are brittle and susceptible to breakage. The same applies to the insulating layer if it is made of a ceramic plate. The use of an aluminum oxide plate is quite common for the insulating support of the PTC element against the inner surface of the heating device housing. To increase electrical safety, corresponding insulating layers are typically provided on both sides. There are proposals to additionally provide these ceramic plates with an electrically insulating foil in order to maintain a certain degree of electrical insulation from the metal heater housing in the event of the ceramic plate breaking.

Electric heating devices are increasingly being operated with higher voltages of 48 volts and more due to electro mobility. Sometimes the electric heating devices are operated with a power current of 100 amperes and more. The measures for electrical safety and dielectric strength must be adapted accordingly.

In particular, the power switch is a semiconductor element, such as a bipolar transistor with an insulated gate electrode (insulated-gate bipolar transistor, IGBT). At least two power switches may be formed on the circuit board. The at least one power switch is electrically conductively connected to the circuit board.

Due to the high power currents that the circuit breaker has to switch, waste heat is generated at the circuit breaker that must be dissipated to prevent the circuit breaker from overheating and/or damage to the circuit board to which the circuit breaker is connected and/or other semiconductor elements on the circuit board. For this purpose, the circuit-breaker is in contact with the channel, separated by the partition wall forming the base of the channel. A medium flows through the channel, which is heated by the electrical heating device during operation. This medium can be either liquid or gaseous. The medium may be a liquid, typically water. During operation, the medium flows through the channel and is heated by the waste heat from the circuit breaker, which is conducted through the partition wall, which may be made of a metal. This results in only a small number of heat transfers. The base of the channel is a good conductor of heat, especially if it is made of metal. This reduces the amount of equipment required to dissipate the waste heat from the at least one circuit breaker compared to measures known from the prior art. At the same time, the heat dissipation is efficient, as the waste heat from the circuit breaker is used to heat the medium and does not heat up the air space in the connection chamber.

In particular, the term channel base is understood to mean that this is flat in the area of the system at the circuit breaker—possibly with an electrically insulating film in between—and has no structures. This enables a simple design of the electrical heating device. The channel is formed outside the heating chamber so that a compact design of the electrical heating device is possible. The fluid, which flows through the channel and the heating chamber during operation, serves to dissipate the waste heat from the circuit breaker and to absorb the heat generated by the at least one PTC heating device. Flow channels may be formed via which the medium is guided past the at least one PTC heating device, in particular past at least one heating device housing, in order to absorb the heat generated by the PTC heating device, typically in the corresponding heating device housing.

The channel is regularly spatially separated from the heating chamber or the flow channels and/or is designed with a significantly smaller effective cross-section than the flow channel(s) in order to increase the flow velocity. This increases the heat transfer due to the flow conditions in the channel compared to the flow channel. Like the heating chamber, the channel can be limited on one side by the partition wall. To form the channel, the partition wall can bulge towards the connection chamber and thus protrude towards the connection chamber relative to the section of the partition wall that delimits the heating chamber. A housing element completing the channel on the opposite side can also have a curvature in order to form a channel with a circular or rectangular cross-sectional area. This further housing element may be formed by a section of the fluid housing. The channel can be arranged parallel to the heating chamber and extend over at least one and a half, more typically at least two thirds, of the extension of the heating chamber parallel to the channel.

According to a preferred embodiment of the present invention, the channel top is part of the fluid housing. This further simplifies the structure of the electric heating device. According to a preferred embodiment of the invention, the channel is flow-connected to the heating chamber, in particular the electric heating device has a preferred flow direction in which the channel is formed upstream of the heating chamber. Due to the separate design of the heating chamber and channel, a compact design of the heating chamber is possible.

According to a preferred embodiment of the invention, the channel base is laterally bounded by bulges in the partition wall and the channel top is laterally bounded by bulges in the fluid housing, which are in sealing contact with one another. This enables a simple design of the channel by means of corresponding communicating bulges in the partition wall and in the fluid housing, which lie tightly against each other and may be connected to each other with a material bond. Both the partition wall and the fluid housing may be made of metal and the bulges are pressed together in a sealed manner, press together a sealing material between them or are welded.

According to a preferred embodiment of the present invention, the electronics housing forms a receiving space which is spatially separated from the heating chamber and in which components of the control device are formed. This reduces the heat input from the heating chamber into the control device.

According to a preferred embodiment of the present invention, only an insulating element is formed between the circuit breaker and the base of the channel. Thus, apart from the insulating element for electrically insulating the circuit-breaker from the channel base, there are no other elements between the channel base and the circuit-breaker The electrical insulating element achieves reliable electrical insulation from the—typically metallic—channel base, while at the same time the number of heat transfers is only increased to a limited extent, namely by two. The circuit-breaker may lie firmly, in particular clamping the insulation element, against the channel base. This improves the heat transfer from the circuit breaker to the channel base and thus to the medium flowing in the channel.

The electric heating device may have an inlet connection piece and an outlet connection piece. The channel may be arranged directly downstream of the inlet connection piece in a flow direction from the inlet connection piece to the outlet connection piece. The direction of flow is defined by the design of the inlet connection piece for the inlet of the medium into the heater housing and the outlet connection piece for the outlet of the medium from the heater housing. The term "direct arrangement of the channel downstream of the inlet connection piece" means in particular that during operation the medium flows directly from the inlet connection piece into the channel without first flowing past one or more heating device housings. This means that, during operation, the medium flows through the inlet connection piece into the channel at an inlet temperature and is therefore present at the circuit breaker with the lowest temperature in the flow path. In this way, efficient absorption of the waste heat from the circuit-breaker in the medium can be achieved even without structures in the channel base.

The fluid housing may form flow channels together with the heating device housings, which are flow-connected to the channel. During operation, medium is guided past the at least one heating device housing through these flow channels and absorbs the heat generated by the at least one PTC heating device, which is conducted into the heating device housing by the PTC heating device. In this context, it is preferable that the flow channels are formed downstream of the channel. This ensures that a cooler medium is used to dissipate the waste heat from the circuit breaker. Furthermore, it is preferred that the outlet connection piece is formed downstream of the flow channels so that the medium is guided out of the fluid housing downstream of the at least one heating device housing.

The inlet and outlet connection pieces may be located to the side of the heating chamber and/or directly adjacent to each other in order to achieve a compact design of the electric heating device.

According to a preferred embodiment of the present invention, the electronics housing and the fluid housing are made of a metallic material. The formation of both the electronics housing and the fluid housing from a metal has various advantages. The formation from metal, typically by deep-drawing a metallic sheet, is easy to carry out. Alternatively, it may also possible to manufacture at least one of the elements a) electronics housing and b) fluid housing using a die casting process. Forming the electronics housing from a metallic material also has the advantage that heat conduction, in particular through the channel base and the at least one heating device housing, is improved compared to other materials.

According to a preferred embodiment of the present invention, at least one of the following housings is formed in one piece: a) the electronics housing and b) the fluid housing. This simplifies the manufacture of the electronics housing and/or the fluid housing and the assembly of the electrical heating device.

The channel may be structure-free in the area of the circuit breaker. This means that in this area the channel base is flat and has no structures that protrude into the channel. The flow cross-section of the channel remains constant in this area. This simplifies the structure and design of the electrical heating device.

According to a preferred embodiment of the invention, an inlet connection piece and an outlet connection piece are formed next to the heating chamber. The inlet connection piece and outlet connection piece may extend parallel to at least one PTC heating device in the heating chamber. The design of the inlet connection piece and outlet connection piece next to the heating chamber enables a compact structure of the electrical heating device.

BRIEF DESCRIPTION OF THE DRAWINGS

Further details and advantages of the present invention can be seen from the following description of an embodiment in conjunction with the drawing. In this show.

DETAILED DESCRIPTION

Figure 1:
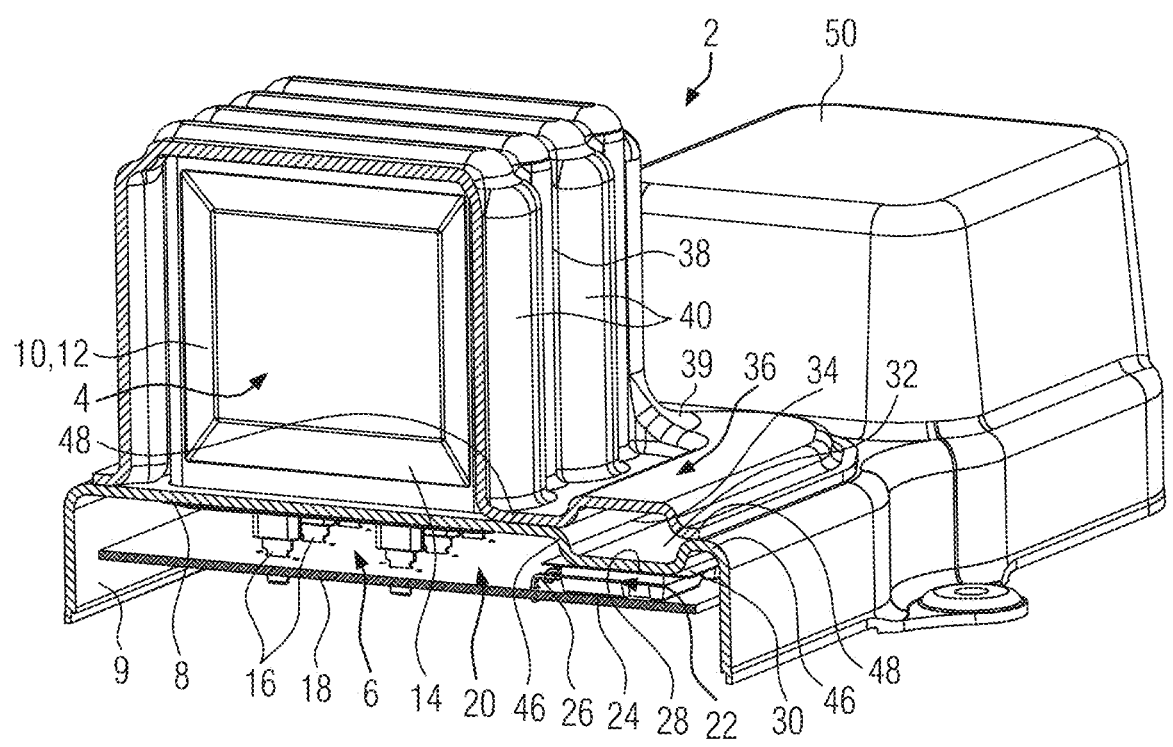
FIG. 1 is a perspective, partially cutaway view of an electric heating device.
Figure 2:
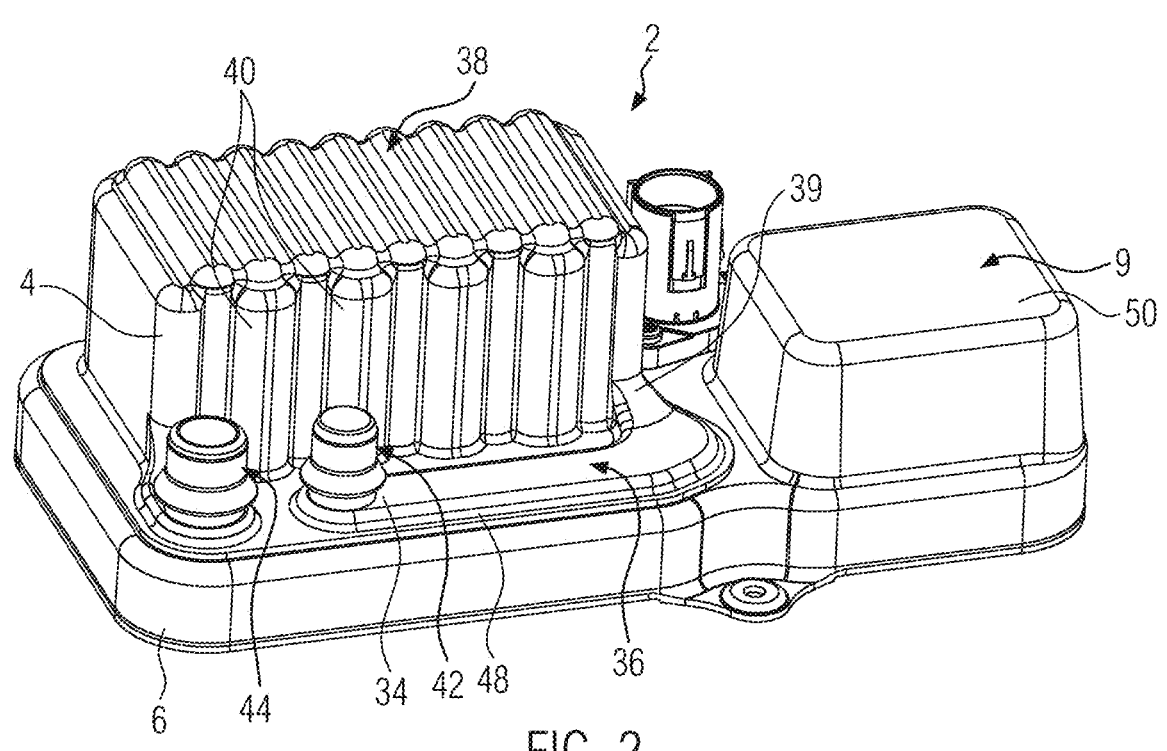
FIG. 2 is a perspective view of the design example shown in FIG. 1.

FIGS. 1 and 2 show an example of an electric heating device 2 in different views. These figures are described together below, unless explicit reference is made to one of the figures. FIG. 1 shows the electrical heating device 2, which has a heating chamber 4 and a connection chamber 6, which are separated from each other by a partition wall 8. The partition wall 8 is part of an electronics housing 9. Heating device housings 10 protrude from the partition wall 8, forming receiving pockets 12 for PTC heating devices 14. A PTC heating device 14 is known, for example from DE 10 2020 208 643 A1. The PTC heating device 14 comprises a PTC element, not shown here, which is electrically contacted in the connection chamber 6. For contacting, the PTC element has contact plates or the like, which have contact tongues 16 that protrude into the connection chamber 6. For the sake of clarity, not all contact tongues 16 in FIG. 1 are provided with reference signs. Each PTC heating device 14 has two contact tongues 16 to apply a voltage to them. In the connection chamber 6, as in this example, the contact tongues 16 are directly contacted or connected to a printed circuit board 18 of a control device 20 of the electrical heating device 2, for example via a contacting unit or a wiring module, which in turn is then connected to the printed circuit board 18.

The control device 20 is used to control the at least one PTC heating device 14. For this purpose, the control device 20 switches power current, which then flows through the PTC heating device 14. For this purpose, at least transistor 22, such as a bipolar transistor with an insulated gate electrode (insulated-gate bipolar transistor, IGBT), is formed on the printed circuit board 18 of the control device 20. The nominal voltage of the PTC heating device 14 in today's applications, particularly in partially or fully electrically powered vehicles, is regularly 48 volts, and power currents of 100 amperes and more are possible. As a result, the transistor 22 generates considerable waste heat, which must be dissipated in order to prevent the transistor 22 and possibly other elements of the control device 20 from overheating.

The transistor 22 has a first side 24 facing the printed circuit board 18 and is connected via electrical connecting elements 26 to conductive tracks on or in the printed circuit board 18, which are not shown. With a second side 28 opposite the first side 24, the transistor 22 is electrically insulated by an insulating element 30 against a part of the partition wall 8, which in this area is formed as a channel base 32, in particular deep-drawn. Channel base 32, transistor 22, insulating element 30 and printed circuit board 18 are dimensioned and positioned in such a way that the transistor 22 presses the insulating element 30 against the channel base 32. The channel base 32 forms a lower part of a channel 34, the upper part 36 of which is part of a fluid housing 38. Channel base 32 and upper channel part 36 do not have any internals or the like, rather they form a smooth channel 34, the cross-section of which is constant in the region of transistor 22. The channel 34 has no structure in the area of the transistor 22. Laterally, the channel 34 is bounded by bulges 46 of the partition wall 8 and by bulges 48 of the fluid housing 38. These bulges 46, 48 extend parallel to each other and are adjacent to each other. The bulges 46, 48 may be connected to each other with a material bond.

In this example, both the electronics housing 9 and the fluid housing 38 are made of metal, in particular by deep drawing from sheet metal. In addition to the upper channel section 36, the fluid housing 38 also forms, together with the heating device housings 10, flow channels 40 around the heating device housings 10. For the sake of clarity, only some of the flow channels 40 are provided with reference signs. The fluid housing 38 forms a flow path 39 of the heating chamber 4, which in this example is composed of the channel 34 and the flow channels 40.

FIG. 2 shows a perspective view of the electrical heating device 2. The fluid housing 38 has an inlet connection piece 42 through which, during operation, the medium, in particular a liquid medium comprising water, first flows directly into the channel 34 and downstream of the channel 34 through the flow channels 40 until it leaves the fluid housing 38 again through an outlet connection piece 44. Inlet connection pieces 42 and outlet connection pieces 44 are formed next to the heating chamber 4 and extend parallel to the PTC heating devices 14 in the heating chamber 4. The inlet and outlet connection pieces 42; 44 are located laterally next to the heating chamber 4 directly adjacent to each other in such a way that the hoses supplying or discharging the medium to be heated can still be easily connected to the connection pieces 42; 44.

The channel 34 is located directly downstream of the inlet connection 42. During operation, medium with an inlet temperature is supplied via the inlet connection 42. When flowing out of the outlet connection 44, the medium has a higher outlet temperature. Thus, during operation, medium initially flows through the channel 34 at a relatively low temperature, so that the waste heat from the transistor 22 is initially used to heat up the medium. After flowing through the channel 34, the medium then flows at a higher temperature through the flow channels 40 in order to absorb and dissipate the heat generated by the PTC heating devices 14. The medium then flows out via the outlet connection 44. In this example, the flow path 39 is limited by the inlet connection 42 and the outlet connection 44 and extends from the inlet connection 42 to the outlet connection 44 via the channel 34 and the flow ducts 40.

The electronics housing 9 also forms a receiving space 50 for receiving further elements and components of the control device 20. The receiving space 50 is spatially separated from the heating chamber 4, so that the heat input from the heating chamber 4 into the receiving space 50 is limited. In the present case, the receiving space 50 is formed by a deep drawn pot of the electronics housing 9, with the drawn pot projecting from the connection chamber 6 in the same direction as the fluid housing 38.

The design shown here, in which a transistor 22 is in contact with a flat channel base 32 of a channel 34 through which a medium can flow, either directly or only via the insulating element 30, allows a simple design and layout of the electrical heating device 2. In particular, no installations are required in the channel 34, as the waste heat from the transistor 22 is efficiently dissipated via the medium by the medium flowing past. At the same time, a compact design of the electric heating device 2 is possible.

The invention claimed is:

1. An electric heating device comprising:
   an electronics housing including a partition wall which separates a connection chamber from a heating chamber for emitting heat to a medium to be heated;
   a fluid housing which delimits the heating chamber;
   at least one PTC heating device which is connected to the heating chamber in a thermally conductive manner and which is electrically connected in the connection chamber; and
   a control device which is located, at least in part, in the connection chamber, wherein the control device has at least one transistor which rests against a channel base located outside the heating chamber and formed by the partition wall, wherein the channel base, together with a channel top, forms a channel through which the medium can flow, wherein the channel is spatially separated from the heating chamber, wherein the channel is fluidically connected to the heating chamber, and wherein the channel top and the electronics housing are separate components that are connected to each other in a fluid-tight manner.

2. The electric heating device according to claim 1, wherein the channel top is part of the fluid housing.

3. The electric heating device according to claim 1, wherein the channel is arranged between an inlet connection piece and the heating chamber.

4. The electric heating device according to claim 2, wherein a) the channel base is laterally delimited by bulges of the partition wall and b) the channel top is laterally delimited by bulges of the fluid housing, and wherein the bulges of the partition wall and the bulges of the fluid housing abut against each other in a sealing manner.

5. The electric heating device according to claim 1, wherein the electronics housing forms a receiving space which is spatially separate from the heating chamber and in which components of the control device are located.

6. The electric heating device according to claim 1, wherein only one insulating element is formed between the circuit breaker and the channel base.

7. The electric heating device according to claim 1, wherein at least one heating device housing projects from the partition wall toward the heating chamber and forms a receiving pocket in which the at least one PTC heating device is supported in an insulated manner.

8. The electric heating device according to claim 1, wherein the electronics housing and the fluid housing are made of a metallic material.

9. The electric heating device according to claim 8, wherein at least one of the following housings: a) the electronics housing and b) the fluid housing are deep-drawn.

10. The electric heating device according to claim 8, wherein at least one of the following housings: a) the electronics housing and b) the fluid housing, are die-cast.

11. The electric heating device according to claim 1, wherein at least one of the following housings is formed in one piece: a) the electronics housing and b) the fluid housing.

12. The electric heating device according to claim 1, wherein the channel is structure-free.

13. The electric heating device according to claim 1, wherein an inlet connection piece and an outlet connection piece are formed next to the heating chamber.

14. The electric heating device according to claim 1, wherein the channel is separated from the heating chamber and is flow-connected with the heating chamber, wherein the channel top and the electronics housing are separate components which are connected in a fluid tight fashion, and wherein the partition wall is formed by the electronics housing.

* * * * *